United States Patent [19]

Prevost et al.

[11] Patent Number: 4,801,821
[45] Date of Patent: Jan. 31, 1989

[54] INTEGRATED BISTABLE ELECTRONIC COMMUTATOR WITH A LOW VOLTAGE DROP

[75] Inventors: Claude Prevost, Saint Aubin de Medoc; Gérard Le Bourhis, Saint Medard en Jalles, both of France

[73] Assignee: Aerospatiale Societe Nationale Industrielle, Paris, France

[21] Appl. No.: 106,555

[22] Filed: Oct. 8, 1987

[30] Foreign Application Priority Data

Oct. 8, 1986 [FR] France .................. 86-14006

[51] Int. Cl.$^4$ .................. H03K 3/26; G02B 27/00
[52] U.S. Cl. .................. 307/311; 307/247.1; 307/279; 250/551
[58] Field of Search .................. 307/278, 279, 247.1, 307/239, 311, 241–242, 577; 357/23.4; 250/557, 214 R, 214 SW, 214 DC, 213 A, 551

[56] References Cited

U.S. PATENT DOCUMENTS 3,912,951 10/1975 Kihara .................. 250/551
4,603,324 7/1986 Huet et al. .................. 379/379

FOREIGN PATENT DOCUMENTS 0177148 4/1986 European Pat. Off. .

OTHER PUBLICATIONS

IBM Technical Disclosure Bull. 26, No. 12, pp. 6611–6613, May 1984, Hutson, D. J., "High Voltage Switch".
IEEE Electro 8 pp. 7/3 (1/9), 1983, Rodriguez, E. T., "Optically Coupled Power MOSFET Technology".
Mesures-Regulation-Automatisme, 41, No. 6, Jun., 1976, pp. 45–61, Loriferne: "Les Composants Utilises dans les Convertisseurs".
Machine Design 56, No. 24, pp. 22–24, 26, Oct. 1984, Carlisle, B., "Power Integration Techniques Bring Single Chip Relays".

Primary Examiner—Stanley D. Miller
Assistant Examiner—N. Thai
Attorney, Agent, or Firm—Michael N. Meller

[57] ABSTRACT

Integrated bistable electronic commutator comprising a switch provided with at least two terminals, said switch incorporating at least one MOS power transistor (8); a MOS technology control circuit (10) having a bistable flip-flop provided with an input for setting to "1" and an input for setting to "0" and at least one control output, each control output being connected to the gate of at least one MOS power transistor of the switch; an integrated power supply (12) for supplying said circuit; and two optical couplers (14, 16) which in each case receive an electrical commutating control signal and which in each case transmits said signal to one input of the control circuit, each optical coupler ensuring an electrical insulation of the commutator. The invention relates to bistable commutators of the open-closed and rest-working type, which are monodirectional and bidirectional, for direct current and for alternating current.

11 Claims, 6 Drawing Sheets

INTEGRATED BISTABLE ELECTRONIC COMMUTATOR WITH A LOW VOLTAGE DROP

The present invention relates to an integrated bistable electronic commutator with a low voltage drop in the medium power range, i.e. for switching operations from approximately 10 to 50 A. This commutator is in the form of a single electronic component.

The invention is used in all fields where it is necessary to have fast switching without rebound and in vibratory environments, such as in aircraft, helicopters, satellites, as well as in other ground and naval means.

The invention relates to monodirectional and bidirectional, bistable electronic commutators. A first type of known commutator is constituted by electromechanical relays. These relays exist in the form of monostable relays and also bistable relays which, unlike the first, can remain in position without consuming energy. Electromechanical relays are able to switch both low and high power levels, or can function as an inverter.

The use of electromechanical relays is limited to certain applications as a result of their slowness. Moreover, they have axes sensitive to accelerations, so that it is difficult to use them in aircraft or satellites. Finally, numerous electromechanical relays switch with rebounds.

A second type of commutator is known, which is in static commutator form. Unlike electromechanical relays, static relays have a high switching speed, are insensitive to accelerations and therefore vibrations and are consequently generally rebound-free.

There are two types of static commutators, namely static relays for direct current or d.c. and static relays for alternating current or a.c.

Direct current static relays do not permit bistability and have a large voltage drop at the terminals of the circuit of approximately 1.5 to 2 V. Alternating current static relays can only be used in a.c., because redisconnection is impossible in direct current.

Static relays are in particular described in the following documents:

(a) FR-A-2 567 340, in which the relay is only monostable and the charge can only be in the drain of the MOS power transistor constituting the switch (i.e. the transistor only interrupts the low potential in d.c.). Moreover, there is a high voltage drop, because a shunt is added to the conductive resistor $R_{on}$ of the MOS transistor.

(b) EP-A-0 164 770, in whose apparatus there is no electrical insulation between the means supplying the control signal to the commutator and the transistor forming the switch. This apparatus is monostable and monodirectional and requires an auxiliary power supply. Finally, the charge is necessarily in the emitter of the transistor and there is a high voltage drop.

(c) EP-A-0 165 121, which describes a control device for a monostable static commutator. The insulation between the control and the use is provided by a transformer, which leads to high overall dimensions. For certain configurations of use, it is also necessary to have an auxiliary power supply.

(d) EP-A-0 166 390, whose apparatus is monostable, only functions in a.c. and has no insulation between the control and use. In addition, there is a large voltage drop.

(e) U.S. Pat. Nos. 4,571,513, 4,553,151, 4,551,643 and 4,542,396 relate either to the structures of switches, whose control is not completely insulated from the use, or to circuits using thyristors or optothyristors as switches. In the latter case the commutator can only operate in a.c., redisconnection in d.c. being impossible. Moreover, the voltage drop at the terminals of the equipment is high.

The invention more particularly aims at obviating the disadvantages of known static or electromechanical commutators. The invention more particularly aims at linking the qualities of electromechanical commutators, particularly a low voltage drop at the terminals and bistability and the qualities of static commutators, particularly the switching speed and insensitivity to vibrations.

More specifically, the present invention relates to an integrated bistable electronic commutator comprising a switch provided with at least two terminals, said switch incorporating at least one MOS power transistor; a MOS technology control circuit having a bistable flip-flop provided with an input for setting to "1" and an input for setting to "0" and at least one control output, each control output being connected to the gate of at least one MOS power transistor of the switch; an integrated power supply for supplying said circuit; and two optical couplers which in each case receive an electrical commutating control signal and which in each case transmits said signal to one input of the control circuit, each optical coupler ensuring an electrical insulation of the commutator.

According to a preferred embodiment, the commutator comprises a single MOS power transistor, whose drain and source constitute the terminals of the switch, an optical coupler commutating the switch in the closed state and the other coupler commutating the switch in the open state. This commutator is bistable, d.c. and of the open-closed type.

According to a first preferred embodiment, said bistable commutator comprises a second MOS power transistor, the sources of said transistors being common and their gates joined, the drains of said transistors constituting the terminals of the switch. This commutator is bidirectional and can consequently be used for a.c. signals.

According to a second preferred embodiment, the commutator comprises two MOS power transistors, whose sources are common and constitute a terminal of the switch, and whose drain provided with series diodes constitute a rest terminal and a working terminal of the switch, and two optical couplers for transmitting commutating signals from the switch in the rest position and in the working position, the control circuit incorporating two control outputs for supplying complimentary signals on the gates of two MOS transistors. This commutator is bistable, d.c. and of the rest-working type.

In each of the modes of the bistable commutator according to the invention, the integrated power supply can e.g. be constituted by batteries or a capacitor. In the latter case means are provided for recharging said capacitor.

Advantageously, each open-closed monodirectional commutator according to the invention can be transformed into a bidirectional commutator by the addition of a diode bridge between the switch terminals.

The characteristics and advantages of the invention can be better gathered from the following description given in an illustrative and non-limitative manner with reference to the attached drawings, wherein show.

Figure 1:
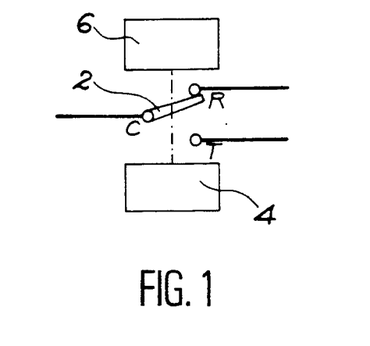
FIG. 1: Diagrammatically the known structure of a rest-working bistable commutator.

FIG. 1 diagrammatically shows the general structure of a rest-working bistable commutator. This commutator comprises a switch 2 provided with a common terminal C, a rest terminal R and a working terminal T, a control circuit 4 for switching the switch from the rest position R into the working position T and a control circuit 6 for switching the switch from the working position T to the rest position R.

Figure 2:
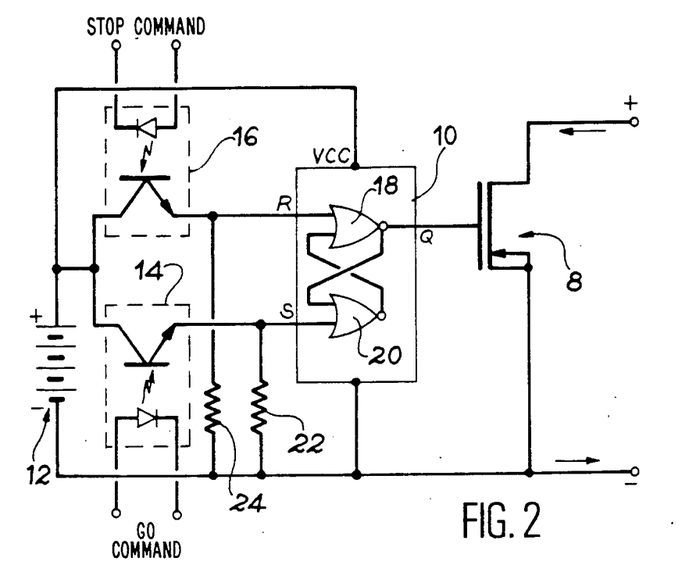
FIG. 2: An embodiment of a d.c., monodirectional, open-closed bistable commutator according to the invention.
Figure 4:
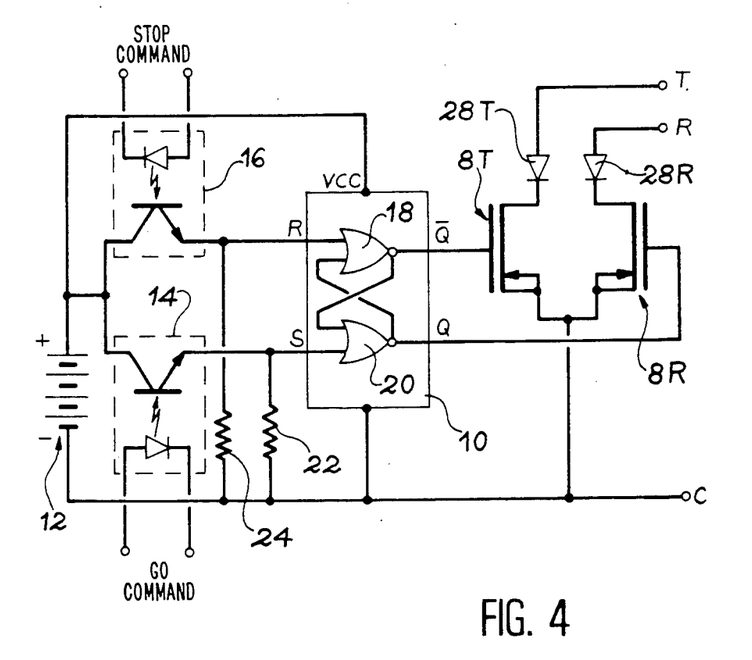
FIG. 4: An embodiment of a d.c., monodirectional rest-working bistable commutator according to the invention.

The invention relates to bistable commutators of the open-closed and rest-working type, which are d.c., a.c., monodirectional and bidirectional. With reference to FIGS. 2 and 4, a description will now be given of different embodiments according to the invention of a commutator of the open-closed type.

FIG. 2 diagrammatically shows a d.c., monodirectional, open-closed bistable commutator in the form of an electronic component. It comprises a switch constituted by a MOS power transistor 8, a control circuit 10 for controlling transistor 8, a power supply 12 for the control circuit 10 and two optical couplers 14, 16, which in each case transmit a switching or commutating control signal ensuring an electrical insulation between the commutator and the circuit emitting the commutating control signal.

Each of the optical couplers 14, 16 comprises a photodiode supplying an optical signal corresponding to an electric commutating signal received and a phototransistor controlled by said optical signal. The collector of the phototransistor is connected to the positive pole of the power supply 12 and the emitter of the phototransistor is connected to one end of a load impedance 22, 24, whose other end is connected to the negative pole of the power supply.

The switch terminals are constituted by the drain and the source of the MOS transistor 8. The resistance in the conductive state $R_{on}$ of the transistor is very low, so that there is only a very small voltage drop between the terminals of the commutator.

The control circuit 10 is preferably a MOS or CMOS circuit, so as to have a low power consumption. In this case, it is possible to use a small battery having a life exceeding 10 years and permitting a number of commutations exceeding $5 \times 10^6$. It comprises a bistable flip-flop, which can be constructed in a conventional manner as shown in the drawing and is constituted by a circuit having two NOR gates 18, 20.

This control circuit makes it possible to store a signal transmitted by one of the optical couplers and to thus maintain the state of the MOS transistor 8 after the commutating signal applied to the optical coupler has disappeared.

The commutator shown in FIG. 2 is monodirectional and can be completed so as to constitute a bidirectional commutator.

Figure 3:
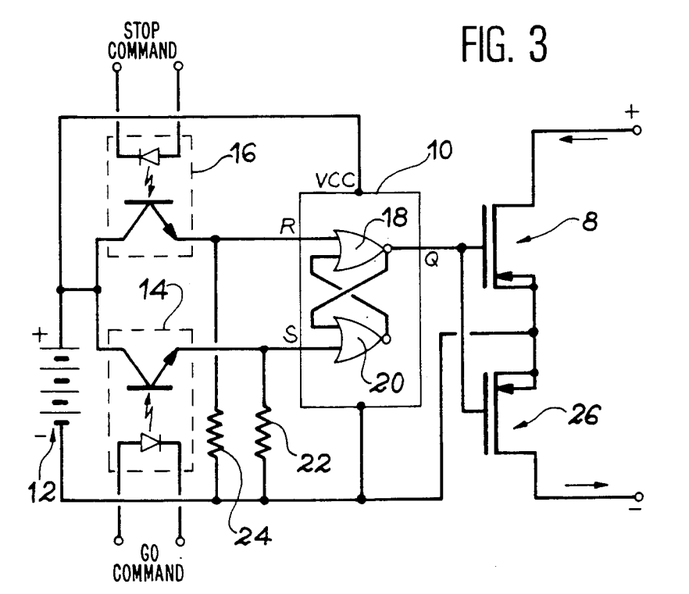
FIG. 3: An embodiment of a bidirectional, a.c. or d.c., open-closed bistable commutator according to the invention.

For example, FIG. 3 shows a bidirectional commutator based on the monodirectional commutator of FIG. 2. The commutator shown in FIG. 3 has the same elements as the commutator shown in FIG. 2. It also comprises a second MOS power transistor 26, whose source is connected to the source of the MOS transistor 8. The gates of these MOS transistors are joined and connected to the output of control circuit 10. The drains of the two MOS transistors form the terminals of the commutator.

A signal passing through the commutator undergoes a small voltage drop. For a signal traversing the commutator of MOS transistor 8 to MOS transistor 26, said voltage drop is largely due to the parasitic diode of the MOS transistor 26. When the signal passes from transistor 26 to transistor 8, the drop is identical and is due to the parasitic diode of MOS transistor 8. Finally, when the two MOS transistors are open, there remain at the terminals of the commutator two parasitic diodes in opposition and the current is then blocked in both directions.

With reference to FIGS. 2 and 3 embodiments of an open-closed commutator according to the invention have been described.

Figure 5:
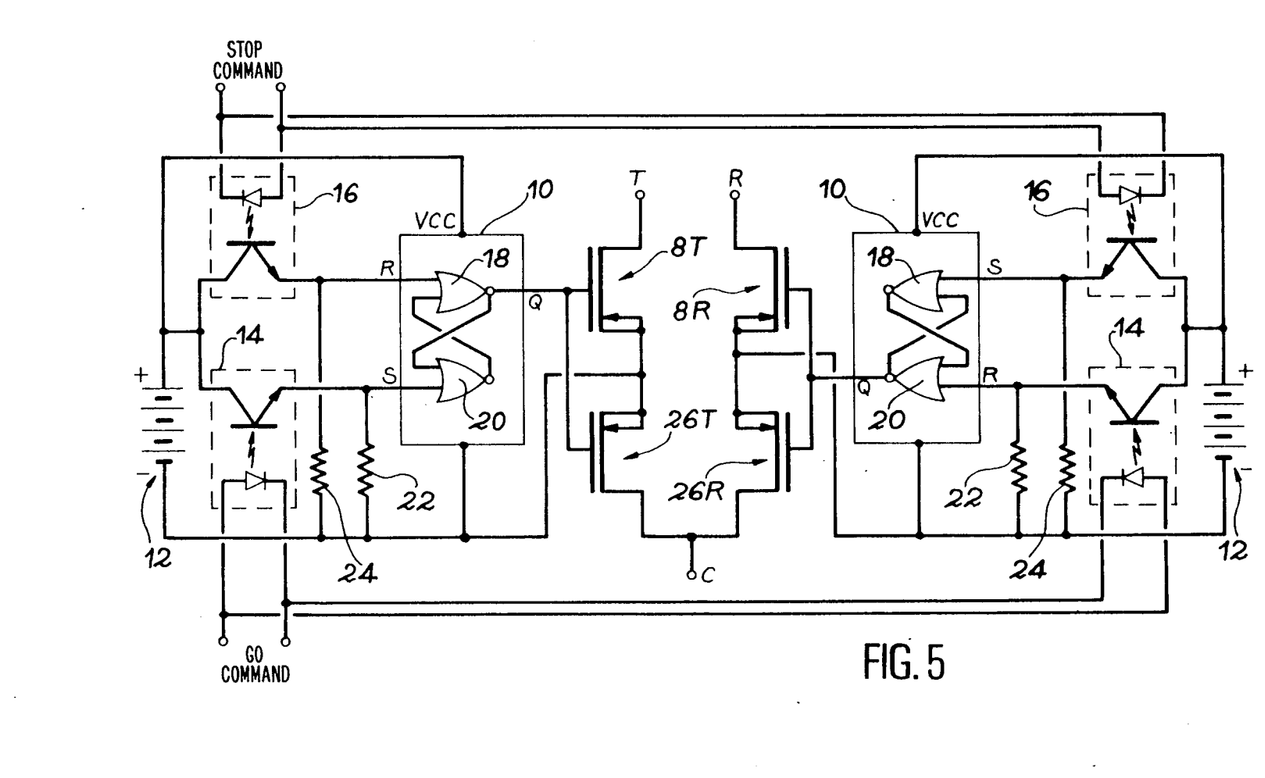
FIG. 5: An embodiment of an a.c. or d.c., bidirectional, rest-working bistable commutator according to the invention.

The invention also applies to rest-working commutators. For example, FIGS. 4 and 5 show embodiments of such a commutator. The bistable commutator shown in FIG. 4 is of the monodirectional, d.c. type. It comprises two MOS power transistors, 8R, 8T, a control circuit 10 for said MOS transistors, a power supply 12 for the control circuit and two optical couplers 14, 16.

The sources of transistors 8R, 8T are connected together and constitute the common point C of the switch. Diodes 28R, 28T are also provided and their cathodes are respectively connected to the drain of transistors 8R, 8T and their anodes respectively constitute the rest terminal R and working terminal T of the switch.

The gates of the transistors 8R, 8T receive complimentary signals supplied by control circuit 10. The latter comprises two control inputs R, S for receiving the signals transmitted by the optical couplers 14, 16. The latter are in each case constituted by a photodiode supplying an optical signal corresponding to an electric switching control signal received and a phototransistor. The latter is connected in series with a high value resistor or impedance 22, 24, the assembly being connected to the terminals of power supply 12.

Control circuit 10 comprises an input R for resetting to 0 and an input S for resetting to 1 and two terminals $\bar{Q}$, Q, respectively connected to the gates of transistors 8T and 8R and supplying complimentary signals.

It is e.g. constituted by two NOR gates 18, 20 forming a bistable flip-flop identical to the control circuit shown in FIG. 3. The only difference between the two control circuits is that the outputs of each of the gates 18, 20 is used in the commutator of FIG. 4.

The rest-working bistable commutator of FIG. 4 is monodirectional and for direct current. This commutator can be modified to give a bidirectional commutator, in accordance with a constructional principle identical to that of the commutator of FIG. 3 compared with the commutator of FIG. 2. This modification consists of placing two assemblies in parallel, but the order "go" for one is in parallel with the order "stop" for the other and vice versa.

For example FIG. 5 shows a bidirectional, bistable commutator based on the commutator of FIG. 3. This commutator is constituted by two essentially identical parts, one corresponding to the working function and the other to the rest function. The part performing the working function is identical to the commutator of FIG. 3, the drains of the MOS transistors 8T, 26T respectively constituting the working terminal T and common terminal C of the commutator.

The part realizing the rest function is based on the part realizing the working function by inversion or reversal of the connections of the photocouplers 14, 16 on inputs R and S of control means 10. These photocouplers are connected in parallel with corresponding photocouplers of the working part.

Thus, a "stop" control applied to the photocouplers 16 of each part activates the input R of the control circuit 10 of the working part and the input S of the control circuit 10 of the rest part, which blocks the transistors 8T, 26T and renders transistors 8R, 26R conductive.

Conversely, a "go" control applied to the photocouplers 16 of each part activates the input S of the control circuit 10 of the working part and the input R of the control circuit 10 of the rest part, which renders conductive transistors 8T, 26T and blocks transistors 8R, 26R.

The commutators shown in FIGS. 2 to 5 are integrated commutators produced in the form of a hybrid component. For example, the following elements can be used for realizing the commutators shown in FIGS. 2 to 5:
optical couplers 14, 16 of type TIL 155 of Texas Instruments or HPCL 2503 of Hewlett Packard, or ISH 711 of Isocom,
CMOS control circuit 10 formed by NOR gates of type CD 4001 BCN of National Semiconductor or MC 14001 UBA1 or MC 14001 BAL of Motorola,
MOS power transistors of type IRF 050 or IRF 150 of International Rectifier or SMM 70N05 of Siliconix,
power supply 12 constituted by lithium batteries of LM 2425 type of Saft, or 11620 type of Catalyst Research Corporation, or type μPowercell B35,
12 MΩ resistors 22, 24.

Thus, the bistable commutator is obtained in the form of a hybrid component, whose dimensions can be smaller than 25×25×15 mm as a result of an appropriate choice and arrangement of the components.

The performance of a commutator according to the invention is essentially dependent on the choice of the MOS power transistor or transistor used in the form of a switch and the power supply of the control circuit. The MOS power transistor must be chosen as a function of the application, namely according to whether it is wished to interrupt a high or low voltage signal with a high or low intensity. With regards the power supply, a high voltage between these terminals permits a low voltage drop at the terminals of the switch for high intensities. When this power supply is constituted by batteries, its capacitance determines the life and number of switching operations.

The performance characteristics of a commutator for direct current according to the invention were measured at 25° C. For a commutated current I of 10 A, a MOS transistor with a peak intensity of 30 A and a power supply constituted by a 6 V battery, the voltage drop measured at the terminals of the MOS transistor is 0.65 V. With a MOS transistor having a peak intensity of 160 A and a power supply constituted by a 10 V battery, the measured voltage drop is 0.4 V.

For a high commutated current and when the voltage drop at the terminals of the commutator is a critical parameter, it is possible to arrange several MOS power transistors in parallel.

The other characteristics of the commutator according to the invention are as follows:
commutating delay $<30$ μs
rise time on resistance $\leq 10$ μs
maximum voltage at terminals 100 V
operating temperature $-55°$ C. to $+125°$ C.
no axis sensitive to vibrations
insulation between control and use 3500 V peak
control current as from 5 mA
minimum duration of control in bistable 0.5 μs
wide operating range from a few millivolts and a few microamperes to a few hundred volts and up to 50 amperes, as a function of the MOS power transistor.

The life of a commutator according to the invention is dependent on the power supply. For a bistable commutator according to the invention used at 25° C., the permanent consumption is approximately 2 nA and the consumption during a commutation is 0.5 μA for the commutating time.

A power supply constituted by 200 mAH batteries and having a loss by ageing of 2% per year, thus makes it possible to perform approximately $10^9$ commutations over a 10 year period whilst only consuming half the capacitance of the battery. For a 50 mAH battery having the same consumption and ageing characteristics, the number of commutations is approximately $300 \times 10^6$.

In the bistable commutators according to the invention shown in FIGS. 2 to 5, the power supply 12 of the control circuit 10 is constituted by batteries which, in certain applications, can lead to disadvantages, particularly as regards volume. This problem can be obviated by replacing the batteries by a capacitor charged on a random power supply.

Figure 6:
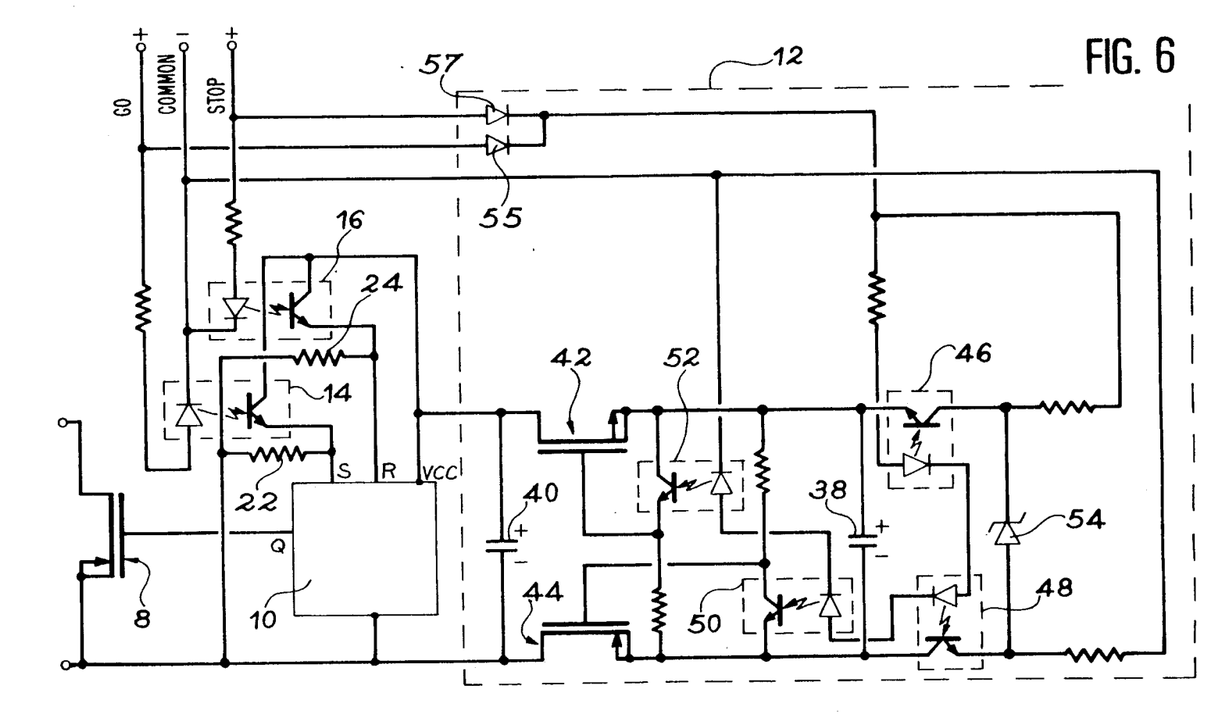
FIG. 6: An embodiment of a commutator according to the invention, in which the supply means is constituted by a capacitor and a means for charging said capacitor.

A bistable commutator according to the invention, whose power supply 12 comprises a rechargeable capacitor is shown in FIG. 6. This bistable commutator is of the monodirectional type and is for direct current, whereof all the elements, except the power supply 12, are the same as those of the commutator of FIG. 2.

In the embodiment of FIG. 8, the power supply 12 comprises a main capacitor 38 and a secondary capacitor 40. The ends of the main capacitor 38 are in each case connected to the power terminals of the control circuit 10 via a switch, the switches being respectively constituted by a P-type MOS transistor 42 and a N-type MOS transistor 44. The supplementary capacitor 40 is directly connected to the supply terminals of control circuit 10.

The power supply 12 also comprises four optical couplers 46, 48, 50, 52. Each optical coupler comprises a photodiode and phototransistor, the photodiodes of the four optical couplers being arranged in series and connected to the control terminals of the commutator, so as to be traversed by a current when one of the stop or go instructions, i.e. opening or closing the switch is received by the commutator. Protection diodes 55, 57 are provided for this purpose on the lines receiving the stop and go instructions. Finally, the power supply 12 comprises a Zener diode 54, which fixes the charging voltage of the main capacitor 38.

When one of the stop or go signals is transmitted to the commutator, the phototransistors of optical couplers 46, 48 are conductive, which places Zener diode 54 and the main capacitor 38 in parallel. This makes it possible to charge the main capacitor 38 to the voltage of the Zener diode. This same control signal renders conductive the transistors of optical couplers 50, 52, which blocks the MOS transistors 42, 44 making it possible to insulate control circuit 10.

When the stop or go control signal disappears, the main capacitor 38 is insulated from the charging voltage and is linked with the control circuit 10 and the supplementary capacitor 40. The latter makes it possible to continue to supply the control circuit during a new charging of the main capacitor 38.

With a main capacitor 38 having a capacitance of 100 μF, the commutator can function for approximately 90 minutes at 8 A. Experience and calculation demonstrate that refreshing every hour is completely adequate for ensuring the operation of the commutator.

The power supply shown in FIG. 6 can e.g. be realized by using the following components:
optical couplers 46, 48, 50, 52 of the Texas Instruments TIL 155 type,
main capacitor 38 of 100 μF, 20V,
supplementary capacitor 40 of type 0.1 μF, 20 V,
Zener diode 54 of 1W, 6.2 V of the BZX85C type,
MOS transistor 42 of the Siliconix VQ2001 type,
MOS transistor 44 of the Siliconix VQ1001 type,
diodes 55, 57 of the 1N 4148 type.

Figure 7:
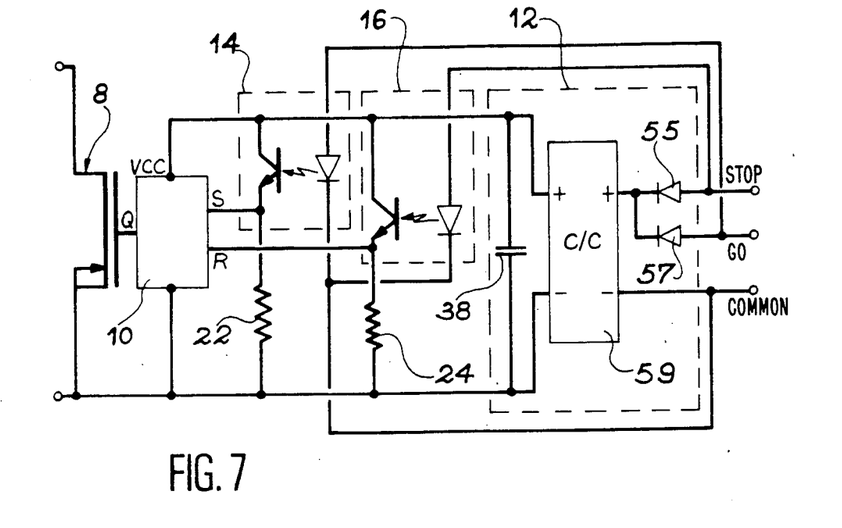
FIG. 7: A variant of the commutator of FIG. 6, in which the capacitor charging means is constituted by a d.c.-d.c. converter.

According to a constructional variant, the power supply can comprise a main capacitor 38 supplied by a d.c.-d.c. converter. A monodirectional, d.c., bistable commutator equipped with such a power supply 12 is shown in FIG. 7. The main capacitor 38 of power supply 12 is directly connected to the supply terminals of control circuit 10. This capacitor is connected to the secondary of a d.c.-d.c. converter 59, whose primary receives the stop or go control signals from the commutator.

The d.c.-d.c. converter must supply the secondary with approximately 2 mA to ensure an appropriate charging time for capacitor 38. Refreshing takes place every hour by giving the stop or go order, which corresponds to the position in which the commutator must be kept. After a long period of non-use, the first switching order must be maintained for a little longer. The d.c.-d.c. converter can be of the Reality V5R9 type.

Bidirectional, bistable commutators according to the invention will be described relative to FIG. 3 and 5. In these embodiments, the bidirectionality has been obtained by the use of pairs of MOS power transistors, whose sources were interconnected and whose gates were joined. Another embodiment consists of providing a d.c. bistable commutator in a diode bridge.

Figure 8A:
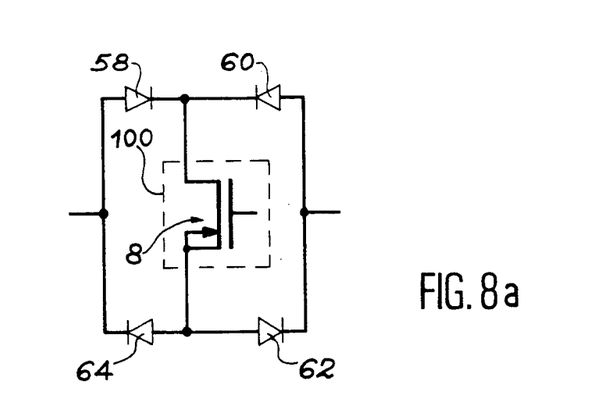
FIGS. 8a and 8b: Bidirectional commutators respectively of the open-closed and rest-working type, transformed into bidirectional commutators by the addition of diode bridges.

In the case of an open-closed type commutator 100, as shown in FIG. 8a, the bidirectionality is obtained by adding a diode bridge 58, 60, 62, 64, whose high and low potential points are respectively connected to the source and drain of a MOS power transistor 8 forming the switch of the commutator.

Figure 8B:
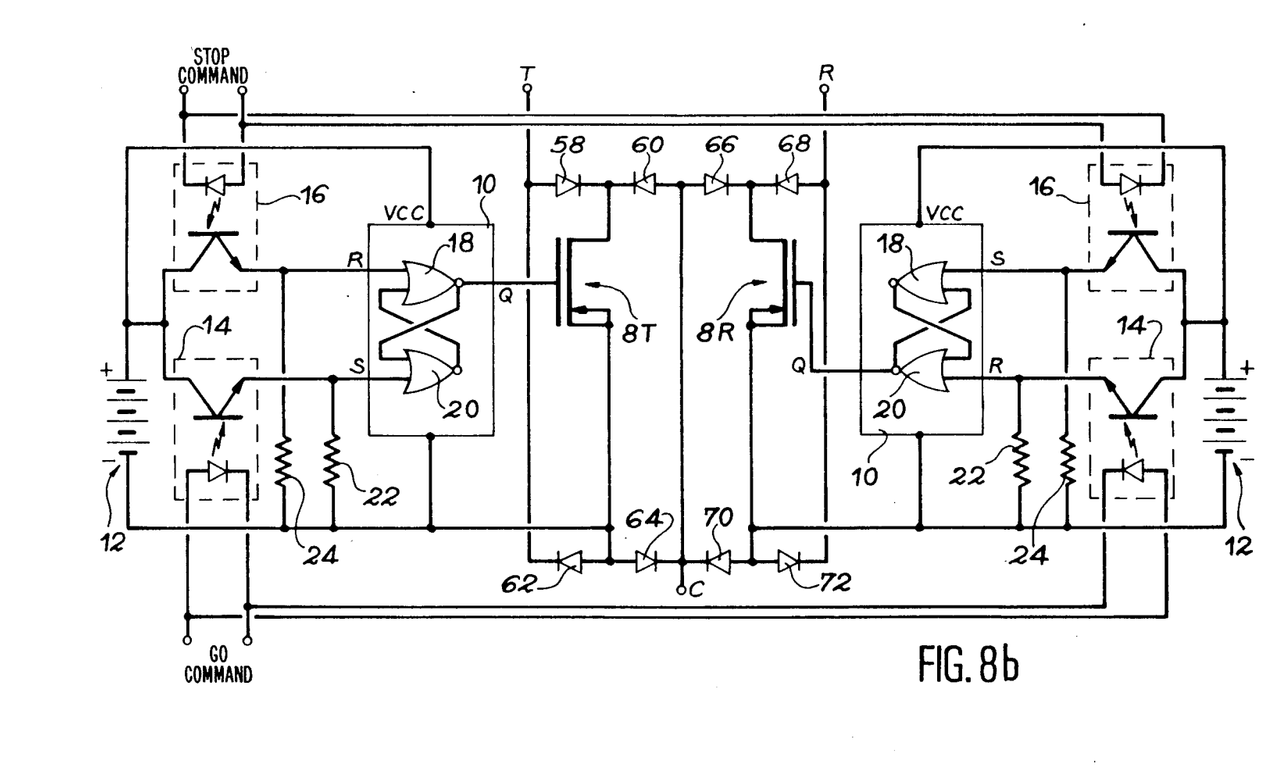

A bidirectional, bistable commutator of the rest-working type is shown in FIG. 8b. Thss commutator comprises two essentially identical parts, one corresponding to the working function and the other to the rest function. The part realizing the working function is identical to the commutator of FIG. 2. The part realizing the rest function is based on the part performing the working function by reversal of the connections of the photocouplers 14, 16 on inputs R and S of control means 10. These photocouplers are connected in parallel with corresponding photocouplers of the working part.

Thus, a "stop" control applied to the photocouplers 16 of each part activates the input R of control circuit 10 of the working part and input S of the control circuit 10 of the rest part, which blocks transistor 8T and renders transistor 8R conductive. Conversely, a "go" control applied to the photocouplers 16 of each part activates the input S of the control circuit 10 of the working part and input R of the control circuit 10 of the rest part, which makes transistor 8T conductive and transistor 8R non-conductive.

For each of the two parts, the bidirectionality is ensured by a diode bridge. Transistor 8T is placed in a diode bridge 58, 60, 62, 64, the source of said transistor being connected to the high potential point of the diode bridge and the drain to the low potential point, the two other ends of the diode bridge being connected to the working terminal and to the common terminal of the commutator. In the same way, transistor 8R is located in a diode bridge 66, 68, 70, 72, whose high and low potential points are respectively connected to the source and to the drain of transistor 8R and whose two other ends are connected to the rest terminal and to the common terminal of the commutator.

The diode bridges make it possible to simply transform a monodirectional commutator into a bidirectional commutator. However, it should be noted that the voltage drop at the terminals of the commutator is higher for the commutators shown in FIGS. 8a and 8b than for the commutators shown in FIGS. 4 and 7, because the current passes through two diodes instead of one. The voltage drop at the terminals of the bidirectional commutators incorporating a diode bridge is consequently approximately 1.2 V.

We claim:

1. Integrated bistable electronic commutator comprising a switch provided with at least two terminals, said switch incorporating at least one MOS power transistor (8, 8T, 8R, 26T, 26R); a MOS technology control circuit (10) having a bistable flip-flop provided with an input for setting to "1" and an input for setting to "0" and at least one control output, each control output being connected to the gate of at least one MOS power transistor of the switch; an integrated power supply (12) for supplying said circuit; and two optical couplers (14, 16) which in each case receive an electrical commutating control signal and which in each case transmits said signal to one input of the control circuit, each optical coupler ensuring an electrical insulation of the commutator.

2. Bistable commutator of the open-closed type according to claim 1, characterized in that it comprises a single MOS power transistor (8), whose drain and source constitute the terminals of the switch.

3. Bidirectional, bistable commutator according to claim 2, characterized in that it comprises a diode bridge (58, 60, 62, 64), whose high and low potential points are connected to the terminals of thw switch.

4. Open-closed-type bistable commutator according to claim 1, characterized in that it comprises two MOS power transistors (8, 26), the sources of said transistors being common and the gates joined, the drains of said transistors constituting the terminals of the switch.

5. Bistable commutator according to claims 2 or 4, characterized in that it comprises two optical couplers (14, 16) for respectively transmitting a commutating signal from the switch in the open state and a commutating signal from the switch in the closed state, the control circuit (10) having two complimentary outputs (Q, $\overline{Q}$).

6. Rest-working-type bistable commutator according to claim 1, characterized in that it comprises two MOS power transistors (8T, 8R), whose sources are common and constitute a common terminal (C) of the switch and whose drains are connected in each case to the cathode of a diode (28R, 28T), whose anodes constitute a rest terminal (R) and a working terminal (T) of the switch, the two optical couplers (14, 16) respectively transmitting a commutating signal from the switch in the working position and a commutating signal from the switch in the rest position, the control circuit (10) having two outputs for transmitting two complimentary signals on the gates of two MOS transistors of the switch.

7. Rest-working-type bidirectional bistable commutator according to claim 1, characterized in that it comprises a switch provided with a working terminal, a rest terminal and a common terminal, said switch having a first and a second MOS power transistor (8T, 8R); for each MOS power transistor a MOS control circuit (10) having a bistable flip-flop provided with an input for setting to "1" and an input for setting to "0" and at least one control output, each control output being connected to the gate of the said MOS power transistor, an integrated power supply for supplying said control circuit, as well as two optical couplers for receiving in each case one electric control commutating signal and for transmitting each signal to an input of the control circuit, each optical coupler ensuring an electrical insulation of the commutator, the control circuits associated with the two MOS transistors receiving the same electric commutating control signal and supplying signals of opposite signs on the gates of said MOS transistors; a first diode bridge (58, 60, 62, 64), whose two ends are connected to the working terminal and to the common terminal of the switch and whose high and low potential points are respectively connected to the source and to the drain of the first MOS power transistor; and a second diode bridge (66, 68, 70, 72), whose two ends are connected to the rest terminal and to the common terminal of the switch and whose high and low potential points are respectively connected to the source and to the drain of the second MOS power transistor.

8. Rest-working-type, bidirectional bistable commutator according to claim 1, characterized in that it comprises a switch provided with a working terminal, a rest terminal and a common terminal, said switch having a first group of two MOS transistors (8T, 26T), whose sources are common and gates joined, the drains of said MOS transistors being respectively connected to the working terminal and the common terminal of the switch and a second group of two MOS transistors (8R, 26R), whose sources are common and whose gates are joined, the drains of said MOS transistors being respectively connected to the rest terminal and the common terminal of the switch and for each group of MOS transistors a MOS control circuit (10) having a bistable flip-flop provided with an input for setting to "1" and an input for setting to "0" and at least one control output, each control output being connected to the gates of said MOS transistors, an integrated power supply for supplying said control circuit, and two optical couplers for receiving in each case an electric commutating control signal and for transmitting said signal to a control input of the control circuit, each optical coupler ensuring an electrical insulation of the commutator, the control circuits associated with the two MOS transistors receiving the same electric commutating control signal and supplying signals of opposite signs to the gates of the MOS transistors of each group of MOS transistors.

9. Commutator according to claim 1, characterized in that the power supply (12) is formed by batteries.

10. Commutator according to claim 1, characterized in that the power supply (12) comprises a capacitor (38) and a recharging means for said capacitor, said recharging means being supplied by the commutating control signals transmitted to the optical couplers.

11. Bistable commutator according to claim 4, characterized in that it comprises two optical couplers (14, 16) for respectively transmitting a commutating signal from the switch in the open state and a commutating signal from the switch in the closed state, the control circuit (10) having two complementary outputs (Q, $\overline{Q}$).

* * * * *